(12) United States Patent
Hara et al.

(10) Patent No.: US 8,228,138 B2
(45) Date of Patent: Jul. 24, 2012

(54) FILTER ELEMENT, DUPLEXER AND ELECTRONIC DEVICE HAVING PIEZOELECTRIC THIN-FILM RESONATORS STACKED VERTICALLY

(75) Inventors: Motoaki Hara, Miyagi (JP); Shinji Taniguchi, Tokyo (JP); Takeshi Sakashita, Tokyo (JP); Tsuyoshi Yokoyama, Tokyo (JP); Masafumi Iwaki, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/177,797

(22) Filed: Jul. 7, 2011

(65) Prior Publication Data

US 2011/0267155 A1 Nov. 3, 2011

Related U.S. Application Data

(63) Continuation of application No. PCT/JP2009/050234, filed on Jan. 9, 2009.

(51) Int. Cl.
  *H03H 9/54* (2006.01)
  *H03H 9/70* (2006.01)
(52) U.S. Cl. .................. 333/133; 333/189; 333/191
(58) Field of Classification Search .................. 333/133, 333/187–192
  See application file for complete search history.

(56) References Cited

U.S. PATENT DOCUMENTS

| 5,194,836 | A * | 3/1993 | Vale et al. ..................... 333/133 |
| 5,382,930 | A   | 1/1995 | Stokes et al. |
| 6,262,637 | B1* | 7/2001 | Bradley et al. ................ 333/133 |
| 6,720,844 | B1  | 4/2004 | Lakin |
| 7,102,460 | B2* | 9/2006 | Schmidhammer et al. ... 333/133 |
| 7,436,269 | B2* | 10/2008 | Wang et al. .................... 333/133 |
| 2004/0201305 | A1 | 10/2004 | Aigner et al. |
| 2005/0093653 | A1 | 5/2005 | Larson, III |
| 2005/0093656 | A1 | 5/2005 | Larson, III et al. |
| 2006/0114080 | A1 | 6/2006 | Larson, III |
| 2006/0232361 | A1* | 10/2006 | Wang et al. .................... 333/133 |

(Continued)

FOREIGN PATENT DOCUMENTS

JP 2005-505178 A 2/2005

(Continued)

OTHER PUBLICATIONS

Kulkarni et al., "Control of Electromechanical Coupling in Stacked Crystal Filters", Applications and Technology Conference, 2006., May 5, 2006, p. 1-p. 7.

(Continued)

*Primary Examiner* — Barbara Summons
(74) *Attorney, Agent, or Firm* — Chen Yoshimura LLP

(57) ABSTRACT

A filter element includes a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed, and a capacitor connected between an input terminal of one of the plurality of multilayer filters of a preceding stage and an input terminal of another one of the plurality of multilayer filters of a following stage, exciting directions of piezoelectric thin-film resonators to which the input terminals of the multilayer filters of the preceding and following stages are connected being opposite to each other.

12 Claims, 22 Drawing Sheets

U.S. PATENT DOCUMENTS

2006/0284707 A1 12/2006 Larson, III et al.
2008/0048802 A1 2/2008 Aigner et al.

FOREIGN PATENT DOCUMENTS

| | | |
|---|---|---|
| JP | 2005-137002 A | 5/2005 |
| JP | 2007-6486 A | 1/2007 |
| JP | 2007-510383 A | 4/2007 |
| JP | 2007-511134 A | 4/2007 |
| WO | 2005/043753 A1 | 5/2005 |
| WO | 2005/043755 A1 | 5/2005 |

OTHER PUBLICATIONS

International Search Report (ISR) issued in PCT/JP2009/050234 (parent application) mailed in Apr. 2009 for Examiner consideration, citing U.S. Patent Nos. 1-2, U.S. Patent Application Publication Nos. 3 and 6, Foreign Patent document Nos. 4-5, and Non-Patent Literature document No. 1 above.

* cited by examiner

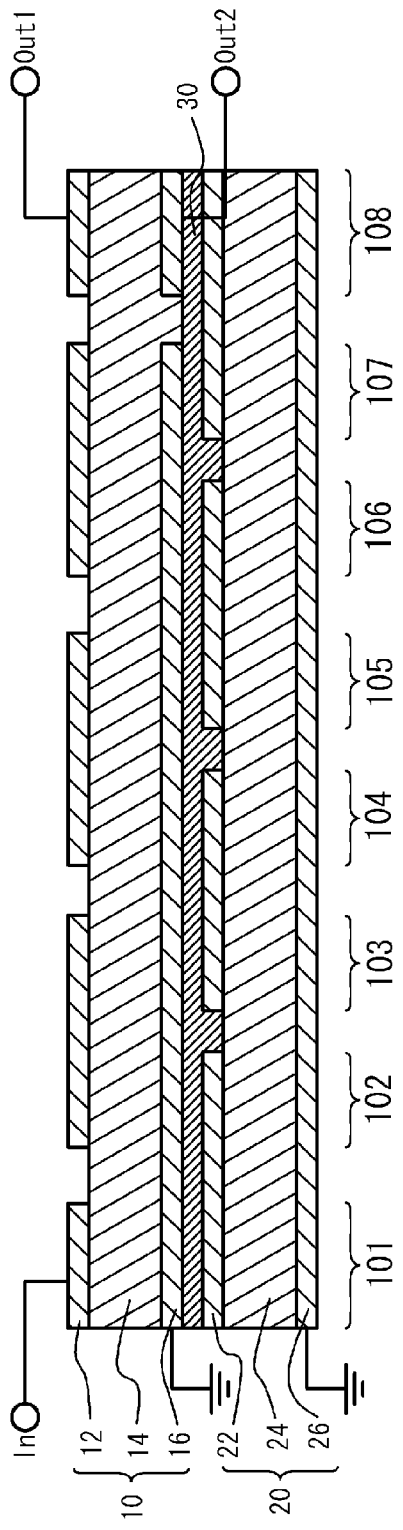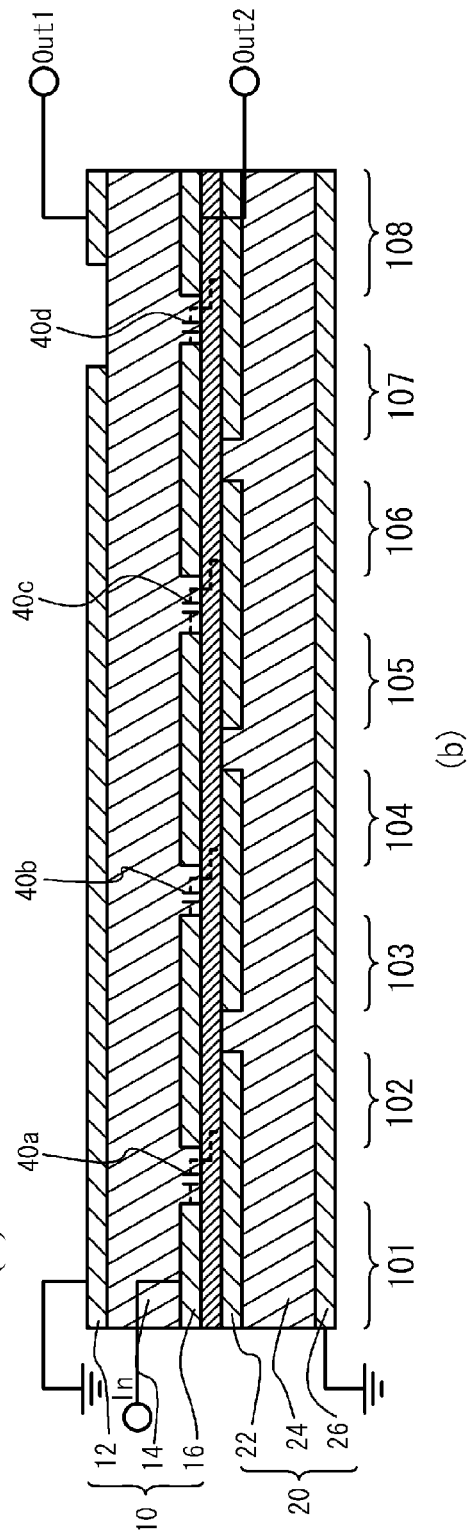
FIG. 18(a)
FIG. 18(b)

FILTER ELEMENT, DUPLEXER AND ELECTRONIC DEVICE HAVING PIEZOELECTRIC THIN-FILM RESONATORS STACKED VERTICALLY

CROSS-REFERENCE TO RELATED APPLICATION

This application is a continuation application of PCT/JP2009/050234 filed Jan. 9, 2009, the contents of which are herein wholly incorporated by reference.

FIELD

A certain aspect of the present invention relates to filter elements, duplexers and electronic devices. Another aspect of the present invention relates to a filter element, a duplexer and an electronic device in which multilayer filters are connected in cascade.

BACKGROUND

There is an increasing demand for compact and light high-frequency filters due to the rapid spread of radio devices, which may be typically cellular phones. Recently, the requirements for the characteristics of the high-frequency filters have been diversified and there have been requirements for increasing the bandwidth and having balanced outputs. As an art that may meet the above requirements, there is known SCF (Stacked Crystal Filter), which is a multilayer filter in which FBARs (Film Bulk Acoustic Resonators) are stacked (see Japanese Patent Application Publication Nos. 2005-505178, 2005-137002, and 2007-510383).

SUMMARY OF THE INVENTION

According to an aspect of the present invention, there is provided a filter element including: a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and a capacitor connected between an input terminal of one of the plurality of multilayer filters of a preceding stage and an input terminal of another one of the plurality of multilayer filters of a following stage, exciting directions of the piezoelectric thin-film resonators to which the input terminals of the multilayer filters of the preceding and following stages are connected being opposite to each other.

BRIEF DESCRIPTION OF THE DRAWINGS

FIGS. 18(a) and 18(b) are schematic cross-sectional views of a comparative example 3 and an embodiment 3;

DETAILED DESCRIPTION

Figure 1:
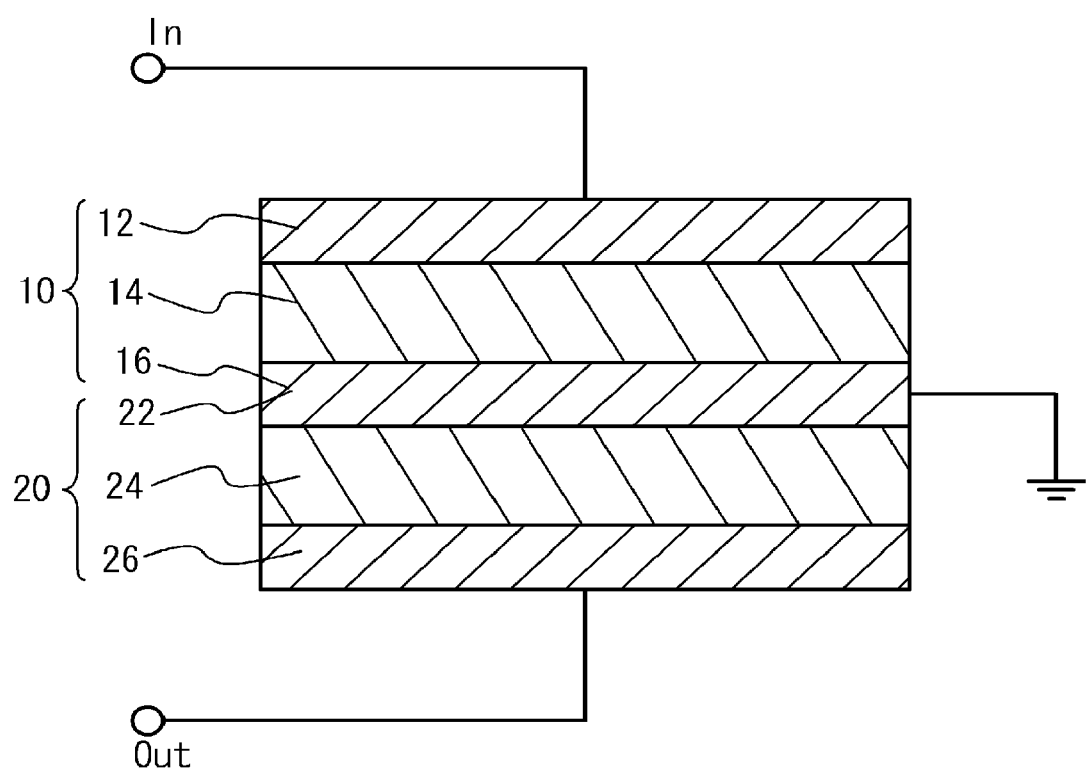
FIG. 1 is a schematic view of a conventional SCF.
Figure 2A:
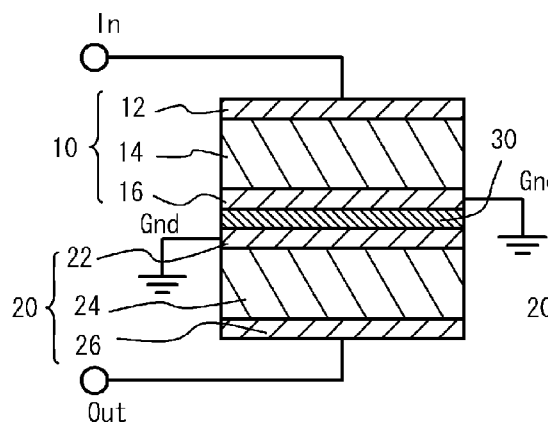
FIGS. 2(a) through 2(d) illustrate other examples of SCF.
Figure 2B:
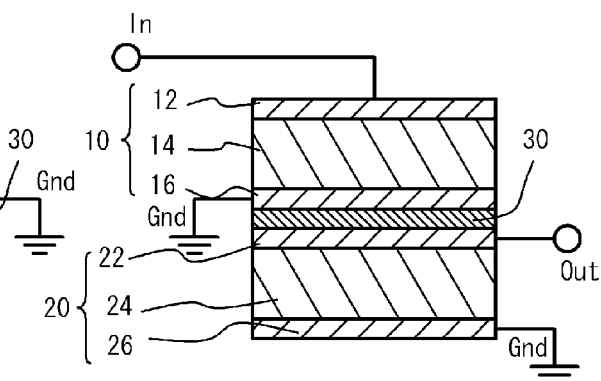
Figure 2C:
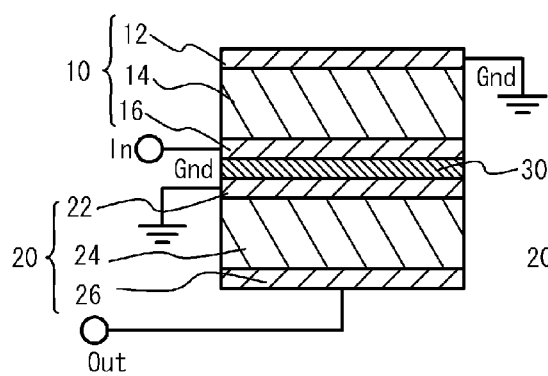
Figure 2D:
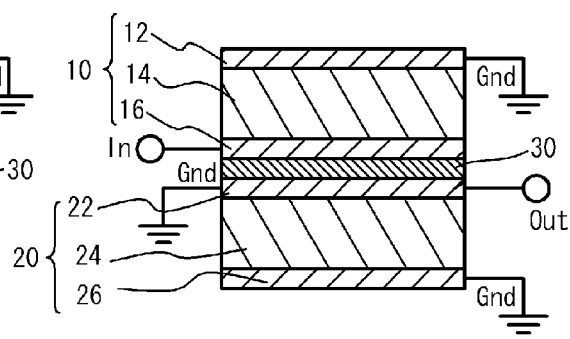

FIG. 1 is a schematic diagram of a related SCF. The related SCF is configured so that piezoelectric thin-film resonators 10 and 20 are vertically stacked. Each of the piezoelectric thin-film resonators 10 and 20 includes a piezoelectric film 14, 24, a pair of electrodes (first electrodes) 12 and 16, 22 and 26, between which the piezoelectric film 14, 24 is vertically interposed. The piezoelectric thin-film resonators 10 and 20 are configured so that the electrodes 16 and 22, for example, are unified. Thus, the piezoelectric thin-film resonators 10 and 20 are mechanically connected together. That is, an acoustic wave is propagated between the piezoelectric thin-film resonators 10 and 20. In the above multilayer filter, it is required to increase the sharpness of filter and have a wide band and to suppress generation of unwanted responses.

FIGS. 2(a)~2(d) are schematic diagrams of other examples of SCF. As illustrated in FIGS. 2(a)~2(d), the piezoelectric thin-film resonators 10 and 20 may be mechanically connected together so that an insulation film 30 is interposed therebetween. In a multilayer filter in FIG. 2(a), the electrode 12 on the upper side (outer side) of the piezoelectric thin-film resonator 10 is connected to an input terminal In, and the electrode 26 on the lower side (inner side) of the piezoelectric thin-film resonator 20 is connected to an output terminal Out. In a multilayer in FIG. 2(b), the electrode 12 of the upper side (outer side) of the piezoelectric thin-film resonator 10 is connected to the input terminal In, and the electrode 22 on the upper side (inner side) of the piezoelectric thin film resonator 20 is connected to the output terminal Out. In a multilayer filter in FIG. 2(c), the electrode 12 on the lower side (inner side) of the piezoelectric thin-film resonator 10 is connected to the input terminal In, and the electrode 22 on the lower side (outer side) of the piezoelectric thin-film resonator 20 is connected to the output terminal Out. In a multilayer filter in FIG. 2(d), the electrode on the lower side (inner side) of the piezoelectric thin-film resonator 10 is connected to the input terminal In, and the electrode 22 on the upper side (outer side) of the piezoelectric thin-film resonator 20 is connected to the output terminal Out. As described above, the input terminal In and the output terminal Out may be connected to first electrodes on any of the upper and lower sides and the outer and inner sides.

Since SCF is configured so that the input terminal and the output terminal are purely mechanically combined together, it is possible to realize balancing (outputting via balanced terminals) without balun or the like. It is thus possible to downsize the filter element. Further, a wide pass band can be realized by adjusting the degree of coupling between the two stacked piezoelectric thin-film resonators.

Figure 3:
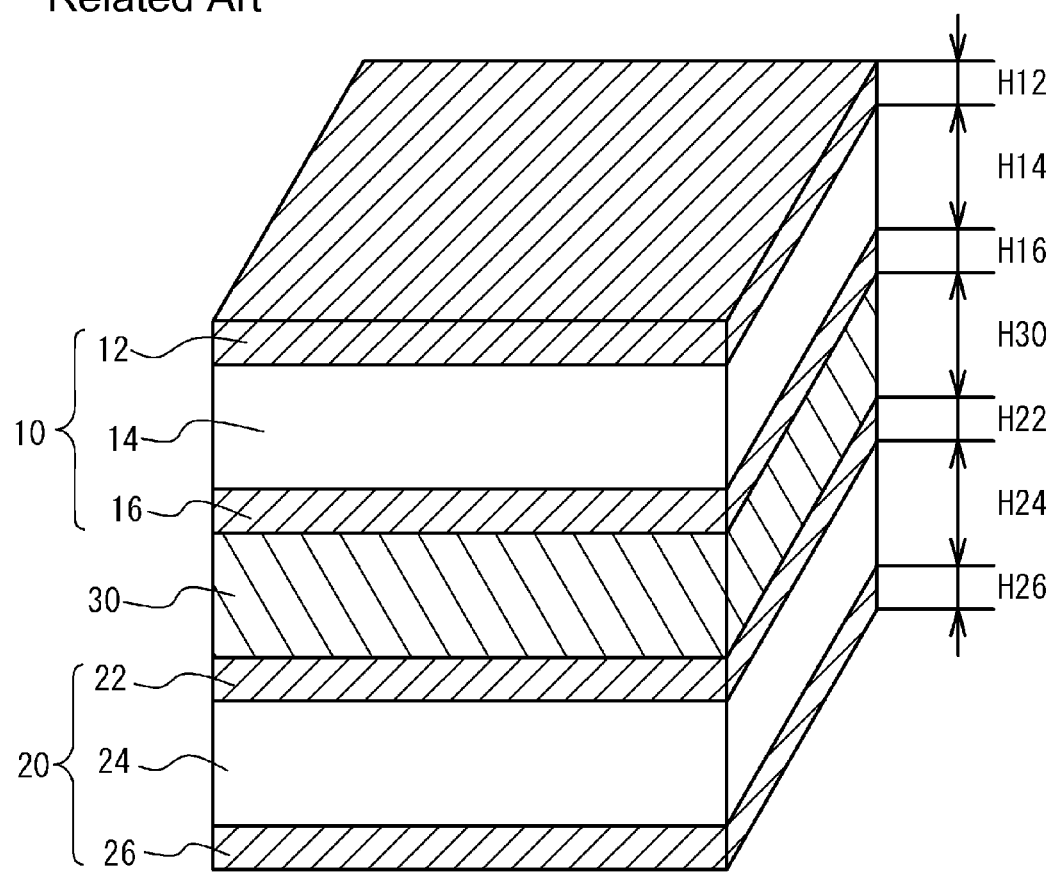
FIG. 3 is a perspective view of an SCF used in a simulation.

The bandpass characteristic of SCF is now described. FIG. 3 is a cross-sectional perspective view of an SCF 100. Ru is used for the electrodes 12, 16, 22 and 26. Aluminum nitride (AlN) indicating an orientation having a main axis in the (002) direction is used for the piezoelectric films 14 and 24. The insulation film 30 uses silicon oxide (SiO). A film thickness H12 of the electrode 12 on the upper side of the piezoelectric thin-film resonator 10, a film thickness H14 of the piezoelectric film 14 and a film thickness H16 of the electrode 16 on the lower side thereof were set to 10, 487 and 172 nm, respectively. A film thickness H22 of the electrode 22 on the upper side of the piezoelectric thin-film resonator 20, a film thickness H24 of the piezoelectric film 24 and a film thickness H26 of the electrode 26 on the lower side thereof were set to 172, 487 and 10 nm, respectively. A film thickness H30 of the insulation film 30 was set to 433 nm, and the area thereof was set to $80 \times 10^{-12}$ m$^2$.

Figure 4:
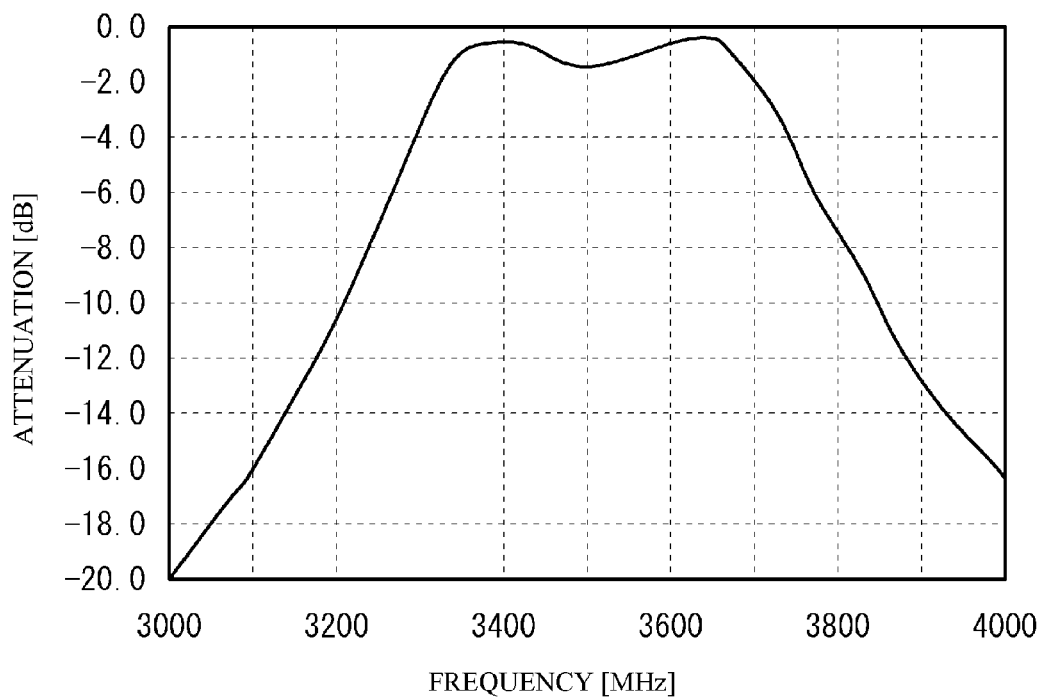
FIG. 4 is a diagram that illustrates a bandpass characteristic of SCF.

FIG. 4 illustrates results of a simulation of the bandpass characteristic of the SCF 100. As illustrated in FIG. 4, the SCF 100 has a wideband, low insertion loss bandpass filter characteristic. However, the SCF 100 has a gentle cutoff characteristic.

Figure 5:
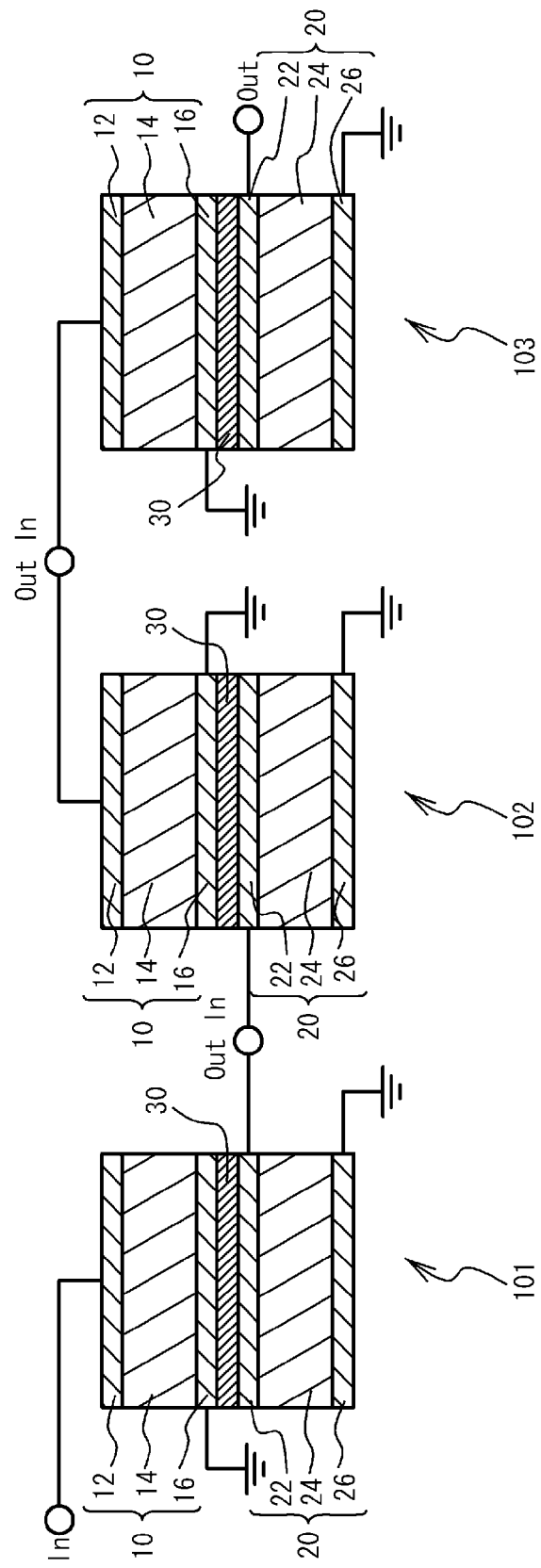
FIG. 5 is a schematic view of a filter element in which SCFs are connected in cascade.

Cascading of SCFs 100 over multiple stages may be considered as a method for sharpening the cutoff characteristic. FIG. 5 is a diagram of a filter in which SCFs 100 are connected in cascade over three stages. As illustrated in FIG. 5, in an SCF 101 of the first stage, the input terminal In is connected to the electrode 12 on the upper side of the piezoelectric thin-film resonator 10, and the output terminal Out is connected to the electrode 22 on the upper side 22 of the piezoelectric thin-film resonator 20. In an SCF 102 of the second stage, the input terminal In is connected to the electrode 22 on the upper side of the piezoelectric thin-film resonator 20, and the output terminal Out is connected to the electrode 12 on the upper side of the piezoelectric thin-film resonator 10. In an SCF 103 of the third stage, the input terminal In is connected to the electrode 12 on the upper side of the piezoelectric thin-film resonator 10, and the output terminal Out is connected to the electrode 22 on the upper side of the piezoelectric thin-film resonator 20. The output terminal Out of the SCF 101 of the first stage and the input terminal In of the SCF 102 of the second stage are connected together, and the output terminal Out of the SCF 102 of the second stage and the input terminal In of the SCF 103 of the third stage are connected together. Cascading is a connection method of interconnecting the output terminal of the preceding stage and the input terminal of the following stage.

Figure 6:
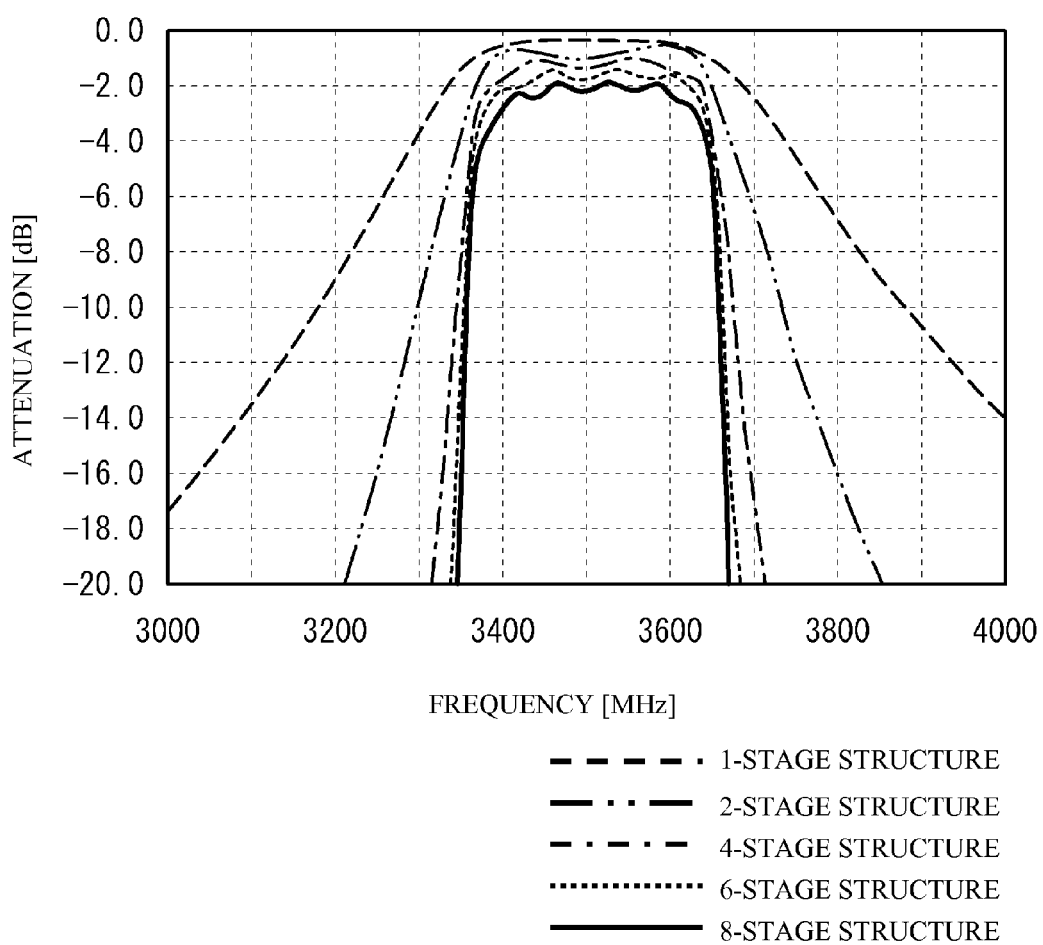
FIG. 6 is a diagram that illustrates a bandpass characteristic of a filter element in which SCFs are connected in cascade.

FIG. 6 illustrates the results of simulating the bandpass characteristic of a filter configured to connect SCFs 100 in cascade, as illustrated in FIG. 5. Filters of non-cascading (a single stage structure), two-stage cascading (two-stage structure), four-stage cascading (four-stage structure), six-stage cascading (six-stage structure), and eight-stage cascading (eight-stage structure) were simulated. As illustrates in FIG. 6, as the number of stages connected in cascade increases, the sharpness of the cutoff characteristic increases.

Figure 7:
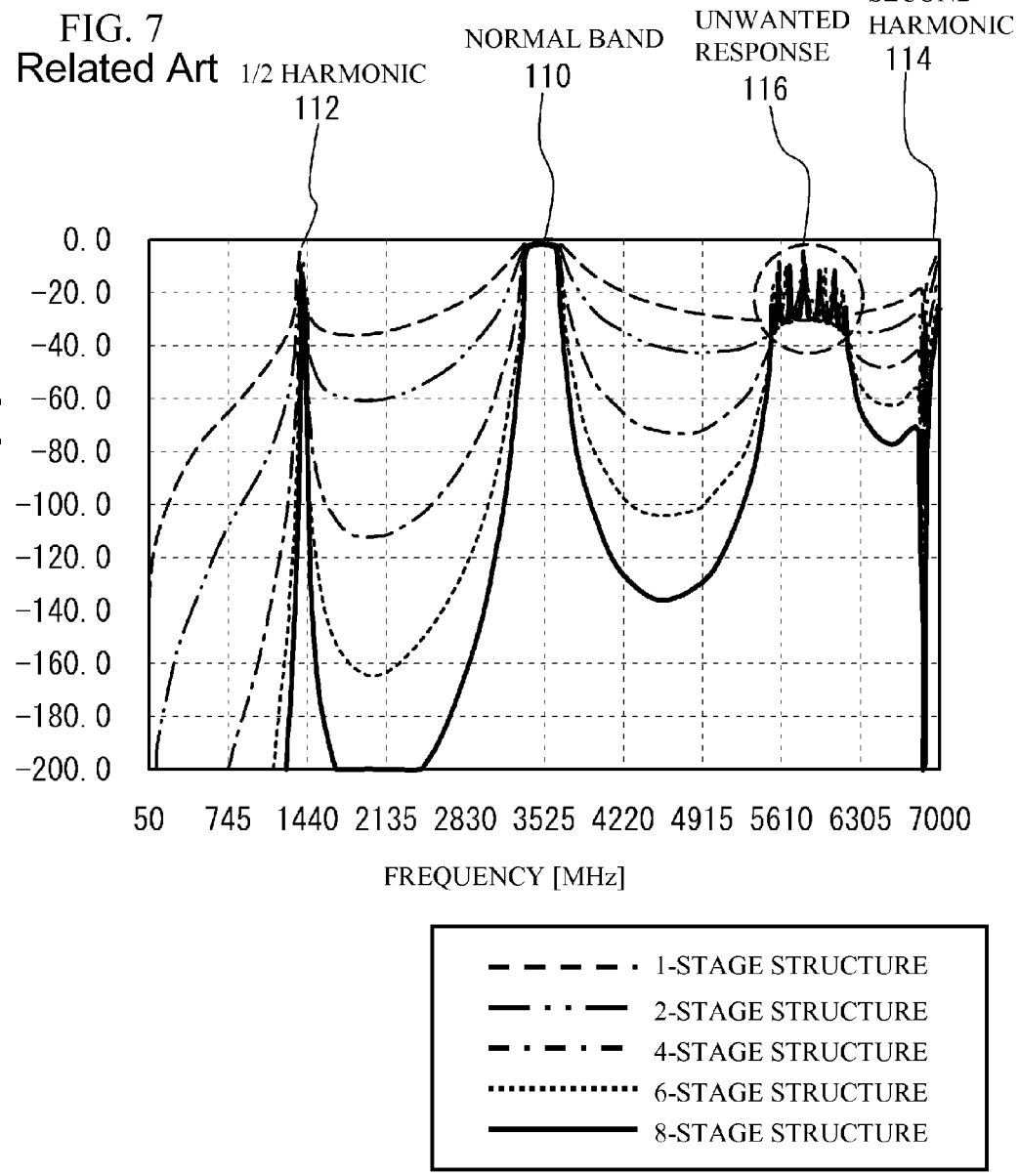
FIG. 7 is a diagram that illustrates a wide band bandpass characteristic of a filter element in which SCFs are connected in cascade.

FIG. 7 is a diagram that illustrates broadband bandpass characteristics of the filters simulated in FIG. 6. Referring to FIG. 7, a ½ harmonic response 112 is observed at a frequency equal to ½ of a pass band 110, and a second harmonic response 114 is observed at a frequency equal to twice the pass band 110. Further, an unwanted response 116 is observed about 6000 MHz.

Figure 8:
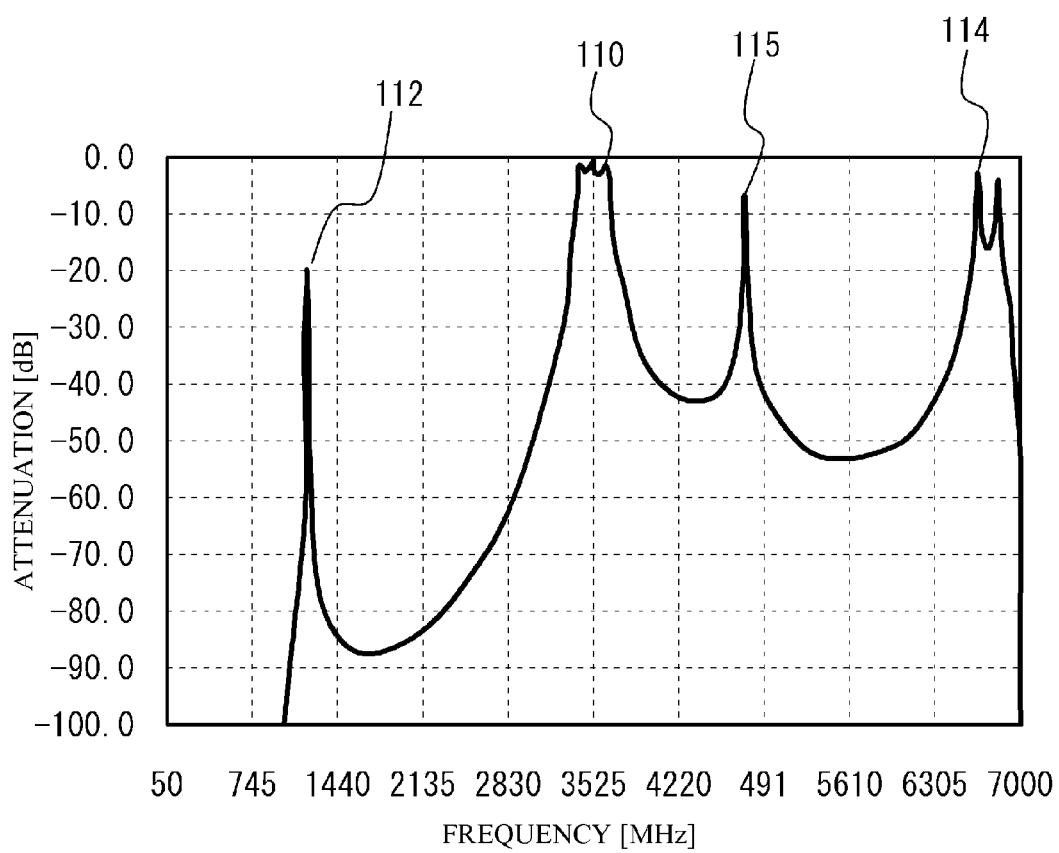
FIG. 8 is a diagram that illustrates a bandpass characteristic of a filter element in which two SCFs are connected in cascade.

FIG. 8 illustrates simulation results of the bandpass characteristic obtained in a case where SCFs are connected in cascade to form two stages. The pass band 110 corresponds to a resonance point of the wavelength of a mechanical vibration within the single SCF. The responses 112 and 114 respectively correspond to resonance points of half harmonic and second harmonic wavelengths of the mechanical vibration within the single SCF. In contrast, the unwanted response 115 is caused in such a mechanism that a response corresponding to the second harmonic within the single SCF shifts towards the low-frequency side due to the static capacitance of the piezoelectric film of the SCF of the other stage.

As the number of stages connected in cascade increases, the unwanted responses 115 that shift towards the low-frequency side of the piezoelectric film of each stage are generated at almost the same frequencies, and form an unwanted response 116 having a wide band. An unwanted response having a narrow band may be suppressed by using L and C. However, it is difficult to suppress the unwanted response 116 having the wide band.

In the following embodiments, in order to suppress the unwanted response 116 having the wide band, the frequencies of the unwanted responses generated at the respective stages are adjusted to suppress expanding of the band of the unwanted response.

Embodiment 1

Figure 9A:
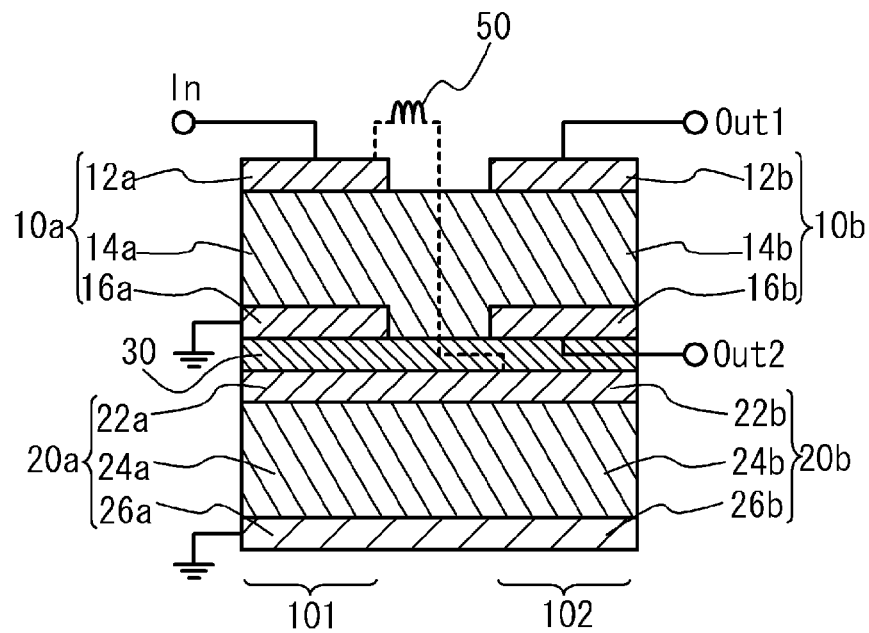
FIGS. 9(a) and 9(b) are schematic cross-sectional views of an embodiment 1.
Figure 9B:
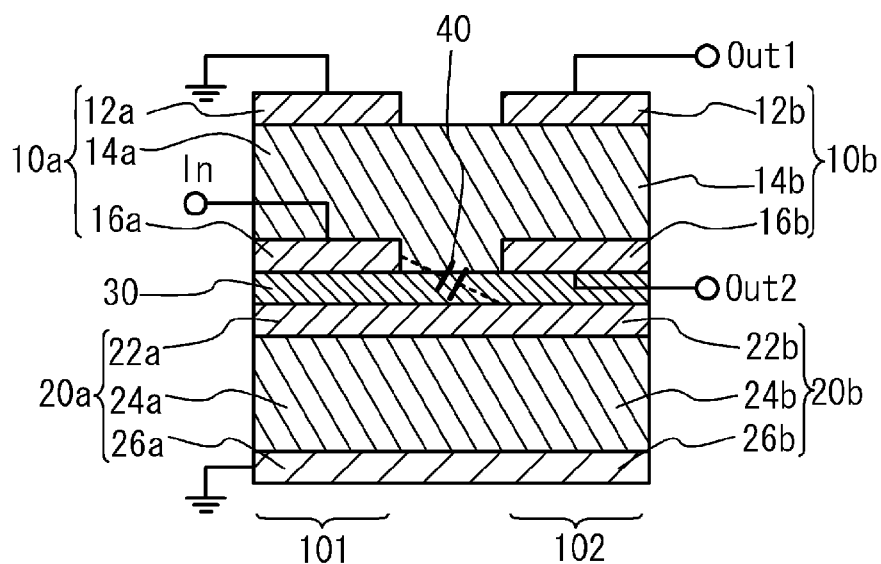

An embodiment 1 is an example in which an inductor or a capacitor is provided between the preceding stage and the following stage. FIGS. 9(a) and 9(b) are schematic cross-sectional views of the embodiment 1. FIG. 9(a) illustrates an example in which an inductor is connected between the SCFs of the preceding stage and the following stage, and FIG. 9(b) illustrates an example in which a capacitor is connected between the SCFs of the preceding stage and the following stage. As illustrated in FIG. 9(a), the SCF 101 and SCF 102 are connected in cascade. In the SCF 101, two piezoelectric thin-film resonators 10a and 20a are vertically stacked, as in the case of FIG. 2. In the SCF 102, two piezoelectric thin-film resonators 10b and 20b are vertically stacked. The piezoelectric thin-film resonators 10a and 10b include piezoelectric films 14a and 14b, upper electrodes 12a and 12b, and lower electrodes 16a and 16b, respectively. Similarly, the piezoelectric thin-film resonators 20a and 20b include piezoelectric films 24a and 24b, upper electrodes 22a and 22b, and lower electrodes 26a and 26b.

The piezoelectric films 14a and 14b of the SCF 101 and the SCF 102 are formed continuously. That is, the piezoelectric films 14a and 14b are formed concurrently. Similarly, the piezoelectric films 24 and 24b are formed continuously. Insulation films 30a and 30b are formed continuously. The input terminal In of the SCF 101 is connected to the electrode 16a. Output terminals Out1 and Out2 are connected to the electrodes 12b and 16b, respectively. The output terminals Out1 and Out2 are balanced terminals, via which signals having mutually opposite phases are output. The electrode 22a of the SCF 101 and the electrode 22b of the SCF 102 are formed continuously. Thus, the output terminal of the SCF 101 and the input terminal of the SCF 102 are connected together. An inductor 50 is connected between the electrode 12a of the SCF 101 (that is, the input terminal of the SCF 101) and the electrode 22b of the SCF 102 (that is, the input terminal of the SCF 102). That is, the input terminal of the SCF 101 and the input terminal of the SCF 102 are inductively coupled with each other.

In FIG. 9(b), the input terminal In of the SCF 101 is connected to the electrode 16a. A capacitor 40 is connected between the electrode 16a of the SCF 101 and the electrode 22b of the SCF 102. That is, the input terminal of the SCF 101 and the input terminal of the SCF 102 are electrostatically coupled with each other. The other structures are the same as those in FIG. 9(a), and a description thereof is omitted.

Figure 10:
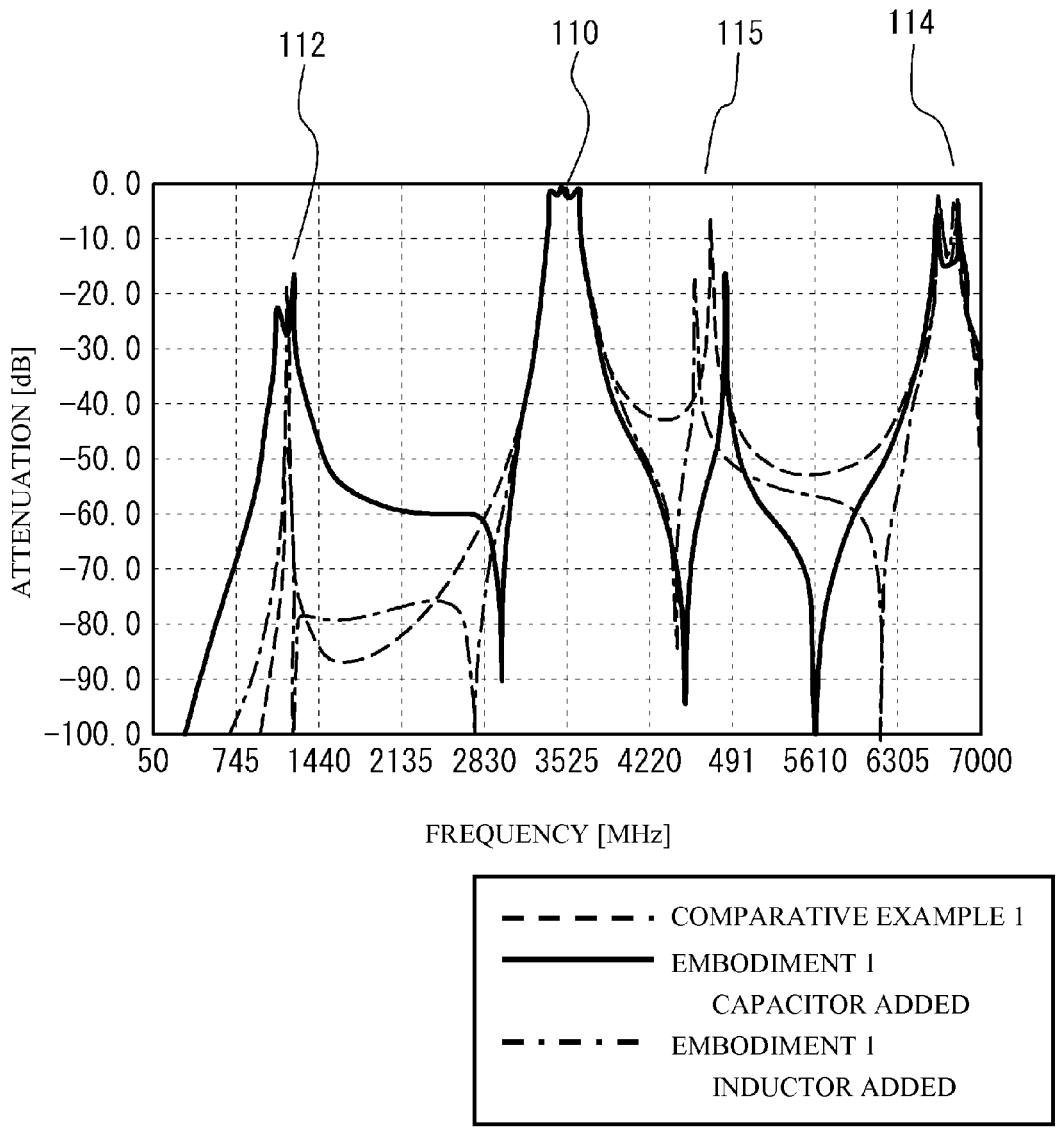
FIG. 10 is a diagram that illustrates bandpass characteristics of the embodiment 1 and a comparative example 1.

FIG. 10 illustrates simulation results of the bandpass characteristic of the embodiment 1. Each of the SCFs 101 and 102 was the same as illustrated in FIG. 3. The inductance of the inductor 50 was set to 17.5 nH, and the capacitance of the capacitor 40 was set to 8 fF. A comparative example 1 is a filter in which the inductor and the capacitor are not connected. As illustrated in FIG. 10, in the embodiment 1 with the inductor being connected, the unwanted response 115 shifts towards the low-frequency side and is reduced. In the embodiment 1 with the capacitor being connected, the unwanted response 115 shifts towards the high-frequency side and is reduced. As described above, according to the embodiment 1, it is possible to shift the frequency of the unwanted response 115. In addition, the unwanted response 115 can be reduced.

Figure 11A:
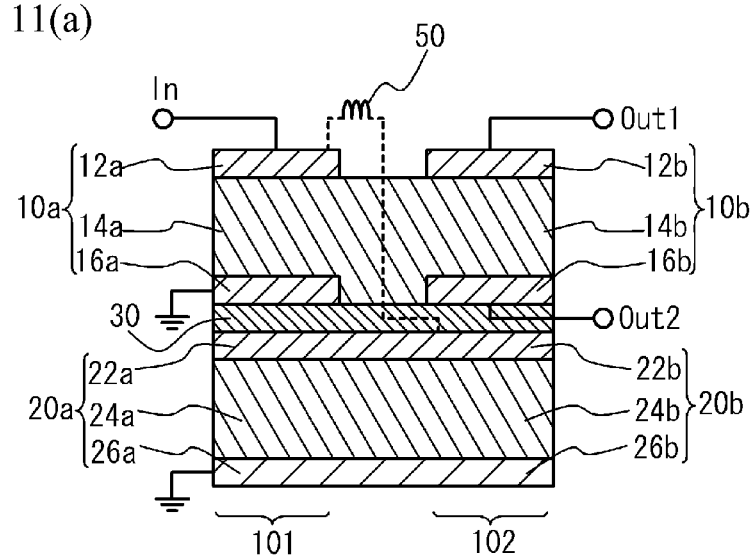
FIG. 11(a) is a schematic cross-sectional view of the embodiment 1 in which two SCFs are connected via an inductor.
Figure 11B:
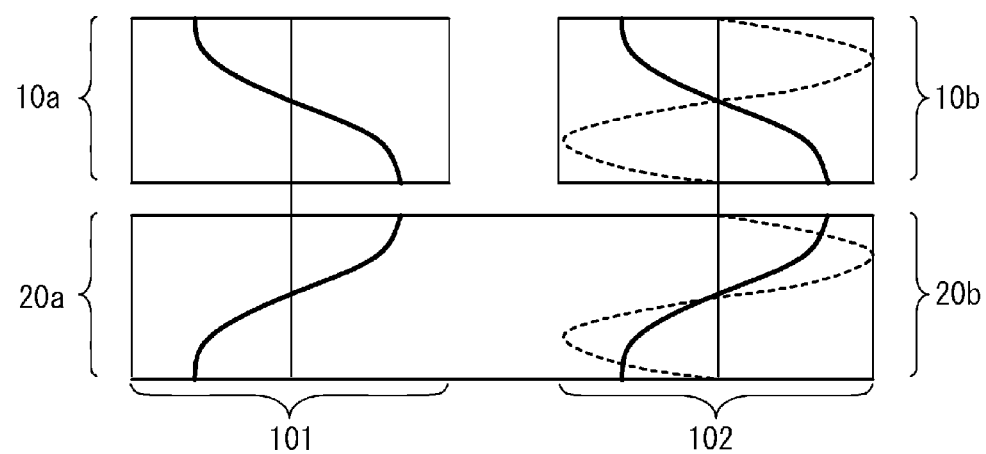
FIG. 11(b) is a diagram that illustrates a mechanical vibration of FIG. 11(a)

Next, the principle of the embodiment 1 is described. FIG. 11(a) is a diagram identical to FIG. 9(a). FIG. 11(b) is a diagram that illustrates a mechanical vibration within each piezoelectric thin-film resonator. The mechanical vibration is indicated by a solid line, and a vibration excited via the inductor 50 is indicated by a broken line. The mechanical vibration is excited in the resonator 10a by the signal that is input to the input terminal of the resonator 10a. This vibration is propagated to the resonator 20a, which is mechanically connected to the resonator 10a. At this time, the vibration is propagated to the resonator 20a from the resonator 10a as a vibration having a continuous waveform, as illustrated in FIG. 11(b). Further, the electric signal of the electrode 22a of the resonator 20a is propagated to the electrode 22b of the resonator 20b via the output terminal of the SCF 101 and the input terminal SCF 102. Thus, the mechanical vibration is excited in the resonator 20b. Thus, the mechanical vibrations of the resonators 20a and 20b are in phase. In contrast, the mechanical vibrations of the resonators 10a and 20b are in opposite phase. The mechanical vibration is propagated to the resonator 10b from the resonator 20b. At this time, the mechanical vibration is propagated to the resonator 10b from the resonator 20b as a vibration having a continuous waveform.

The mechanical vibration excited within the resonator 20b via the inductor 50 is excited in the resonator 20b as indicated by the broken line in FIG. 11(b). The broken line has a wavelength that is half the wavelength of the solid line. This mechanical vibration is also propagated to the resonator 10b from the resonator 20b in a continuous waveform. When attention is paid to the resonator 10b, the phase of the mechanical vibration indicated by the broke line is opposite to the phase of the mechanical vibration indicated by the solid line. Thus, the two mechanical vibrations strongly interfere with each other. It is thus possible to shift the frequencies of the unwanted response. As described above, in the case where the inductor 50 is connected between the input terminal of the preceding SCF 101 and that of the following SCF 102, the exciting direction of the resonators 10a and 20b to which the input terminals are connected may be identical to the stacking direction in which the piezoelectric thin film resonators are stacked. The exciting direction is a direction in which a signal electrode such as the input terminal or the output terminal (for example, the electrode 12a of the resonator 10a or the electrode 22a of the resonator 20b) is positive with respect to a reference point that is a ground electrode (for example, the electrode 16a of the resonator 10a or the electrode 26a of the resonator 20b). In FIG. 11(a), the exciting direction of the resonator 10a is the upward direction, and the exciting direction of the resonator 20b is also the upward direction like the resonator 10a.

Figure 12A:
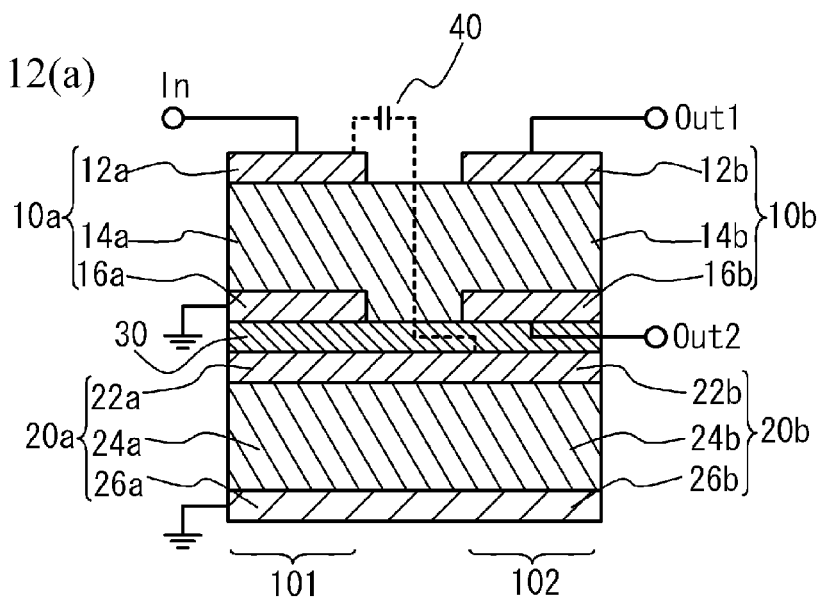
FIG. 12(a) is a schematic cross-sectional view of a case where two SCFs are connected via a capacitor in the same arrangement as that of FIG. 11(a)
Figure 12B:
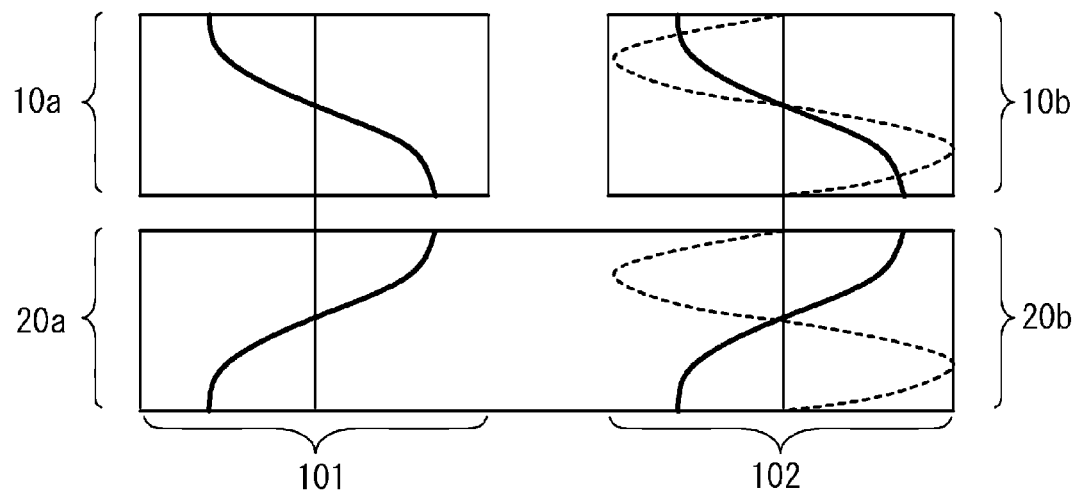
FIG. 12(b) is a diagram that illustrates a mechanical vibration of FIG. 12(a)

FIG. 12(a) is a schematic cross-sectional view of a case where the inductor 50 in FIG. 11(a) is replaced with the capacitor 40. The other structures are the same as those of FIG. 11(a) and a description thereof is omitted. FIG. 12(b) is a diagram that illustrates a mechanical vibration within each piezoelectric thin-film resonator. The mechanical vibrations propagated to the resonators 10a, 20a, 20b and 10b are the same as illustrated in FIG. 12(b). The mechanical vibration excited within the resonator 20b via the capacitor 40 is as indicated by a broken line in FIG. 12(b). The broken line has a wavelength that is half the wavelength of the solid line. When attention is paid to the resonator 10b, the phase of the mechanical vibration of the broken line is not opposite to that of the mechanical vibration of the solid line. Thus, the two mechanical vibrations are not capable of strongly interfering with each other, and the frequency shift of the unwanted response does not occur.

In order to shift the frequencies of the unwanted response by using the capacitor 40, the exciting direction of the resonator 10a to which the input terminal of the SCF 101 of the preceding stage is connected and the exciting direction of the resonator 20b to which the input terminal of the SCF 102 of the following stage is connected are made opposite to each other in the stacking direction.

Figure 13A:
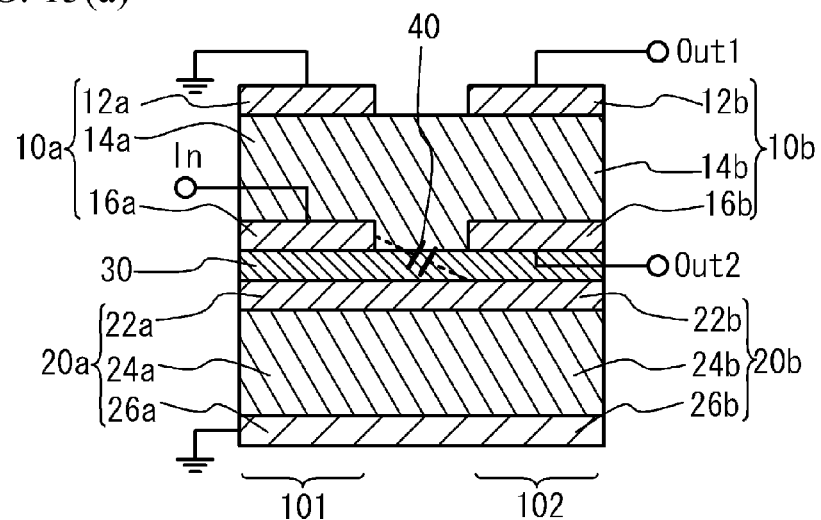
FIG. 13(a) is a schematic cross-sectional view of the embodiment 1 in which two SCFs are connected in cascade.
Figure 13B:
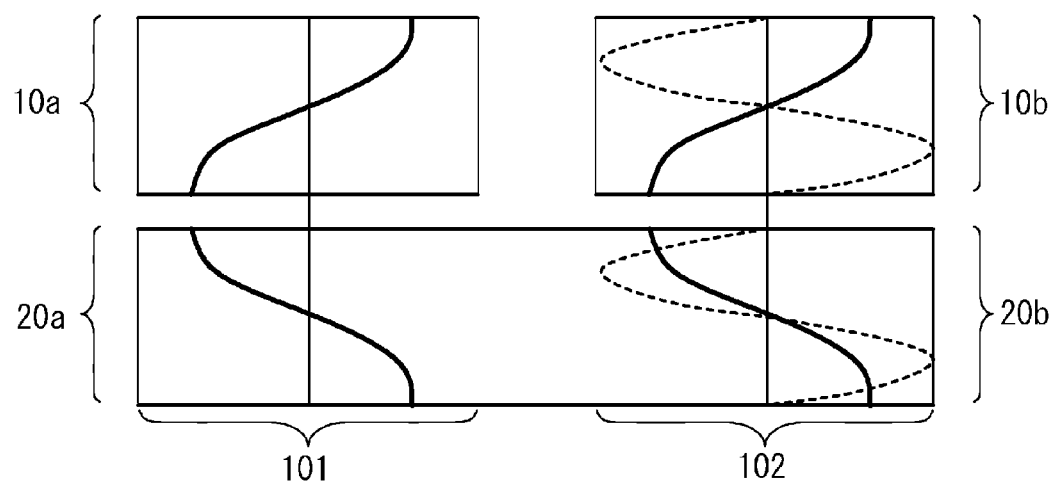
FIG. 13(b) is a diagram that illustrates a mechanical vibration of FIG. 13(a)

FIG. 13(a) is a schematic cross-sectional view of a case where the input terminal In of the SCF 101 is connected to the electrode 16a. In FIG. 13(a), the exciting direction of the resonator 10a to which the input terminal of the SCF 101 of the preceding stage is downward, and the exciting direction of the resonator 20b to which the input terminal of the SCF 102 of the following stage is upward. As described above, the exciting directions of the resonators 10a and 20b are opposite to each other. The details of the structure are the same as illustrated in FIG. 12(a), and a description thereof is omitted. FIG. 13(b) is a diagram that illustrates a mechanical vibration in each piezoelectric thin-film resonator. In FIG. 13(b), the mechanical vibration indicated by the solid line is opposite in phase to the mechanical vibration indicated by the solid line in FIG. 12(b). Thus, the phase of the mechanical vibration within the resonator 10b indicated by the broke line is opposite to that of the mechanical vibration indicated by the solid line. Thus, the two mechanical vibrations interfere with each other strongly, and are capable of shifting the frequencies of the unwanted response.

Figure 14A:
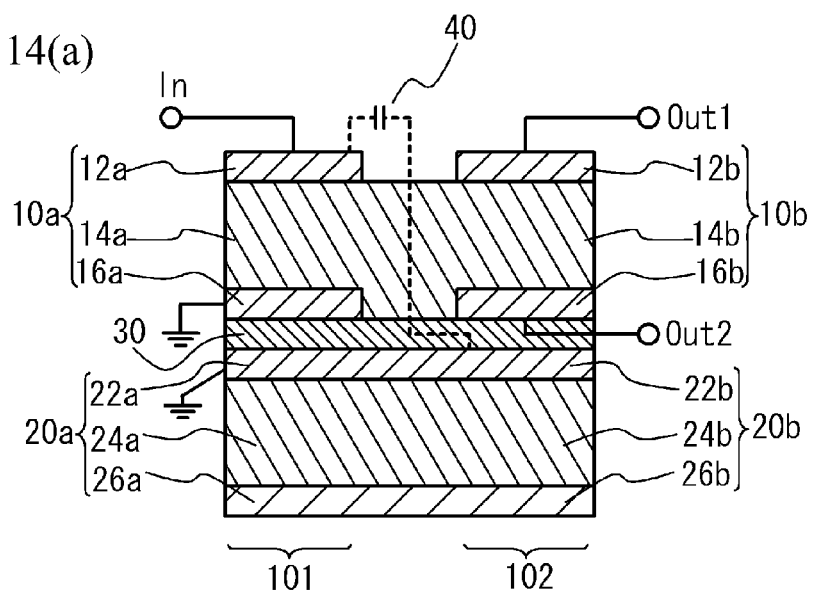
FIG. 14(a) is a schematic cross-sectional view of another example of the embodiment 1 in which two SCFs are connected in cascade.
Figure 14B:
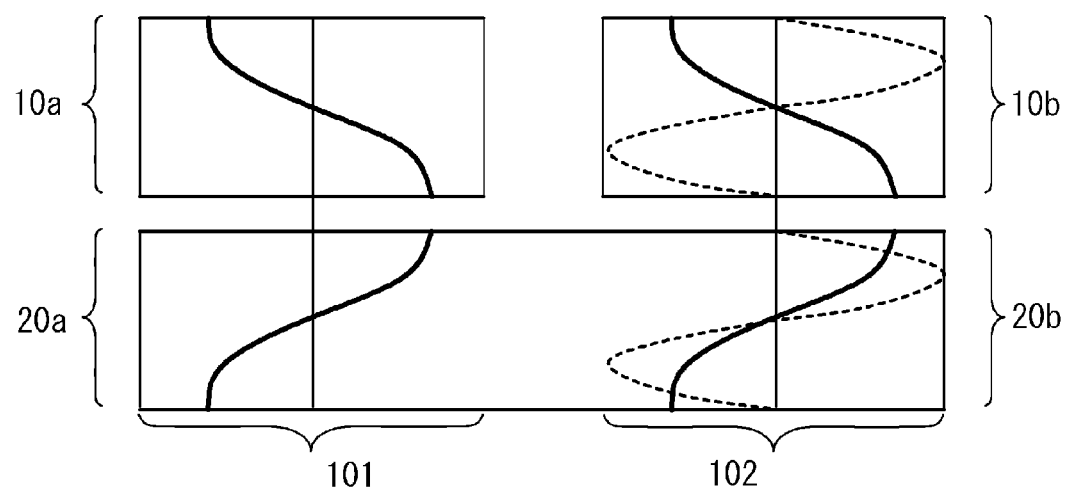
FIG. 14(b) illustrates a mechanical vibration of FIG. 14(a)

FIG. 14(a) is a schematic cross-sectional view of a case where the electrode 12a is connected to the input terminal In of the SCF 101, the output terminal of the SCF 101 is the electrode 26*a*, and the input terminal of the SCF 102 is the electrode 26*b*. In FIG. 14(*a*), the exciting direction of the resonator 10*a* to which the input terminal of the SCF 101 of the preceding stage is upward, and the exciting direction of the resonator 20*b* to which the input terminal of the SCF 102 of the following stage is downward. As described above, in FIG. 14(*a*), the exciting directions of the resonators 10*a* and 10*b* are also opposite to each other. The details of the structure are the same as illustrated in FIG. 12(*a*), and a description thereof is omitted. FIG. 14(*b*) is a diagram that illustrates a mechanical vibration within each piezoelectric thin-film resonator. In FIG. 14(*b*), a mechanical vibration generated via the capacitor 40 indicated by a broken line has a phase opposite to that of the mechanical vibration indicated by the broke in FIG. 12(*b*). Thus, the phase of the mechanical vibration within the resonator 10*b* indicated by the broken line is opposite to that of the mechanical vibration indicated by the solid line. Thus, the two mechanical vibrations interfere with each other strongly, and shift the frequencies of the unwanted response.

Embodiment 2

Figure 15:
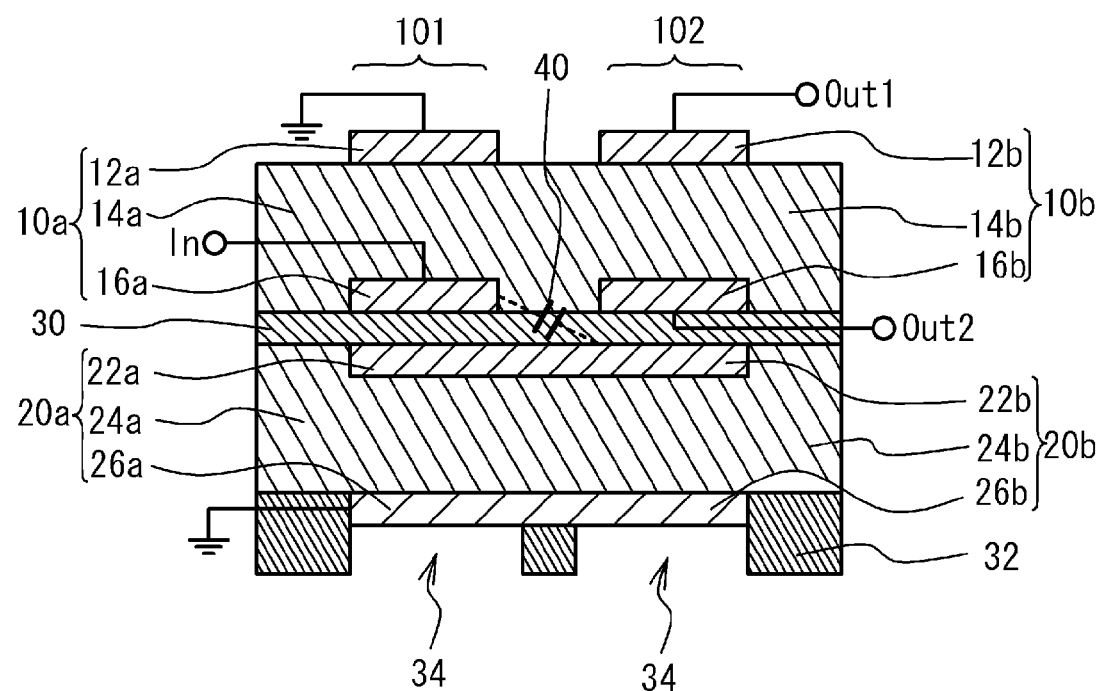
FIG. 15 is a schematic cross-sectional view of an embodiment 2.

An embodiment 2 is an example having a detailed structure of the embodiment 1. FIG. 15 is a cross-sectional view of the embodiment 2. Two SCFs 101 and 102 depicted in FIG. 9(*b*) are formed on a substrate 21 made of silicon, glass or the like. Cavities 34 are formed in the substrate 32 and are located in regions of the SCFs 101 and 102 in which the mechanical vibrations take place (resonance regions). Due to the presence of the cavities 34, the mechanical vibrations of the resonators 20*a* and 20*b* are not restricted.

Figure 16:
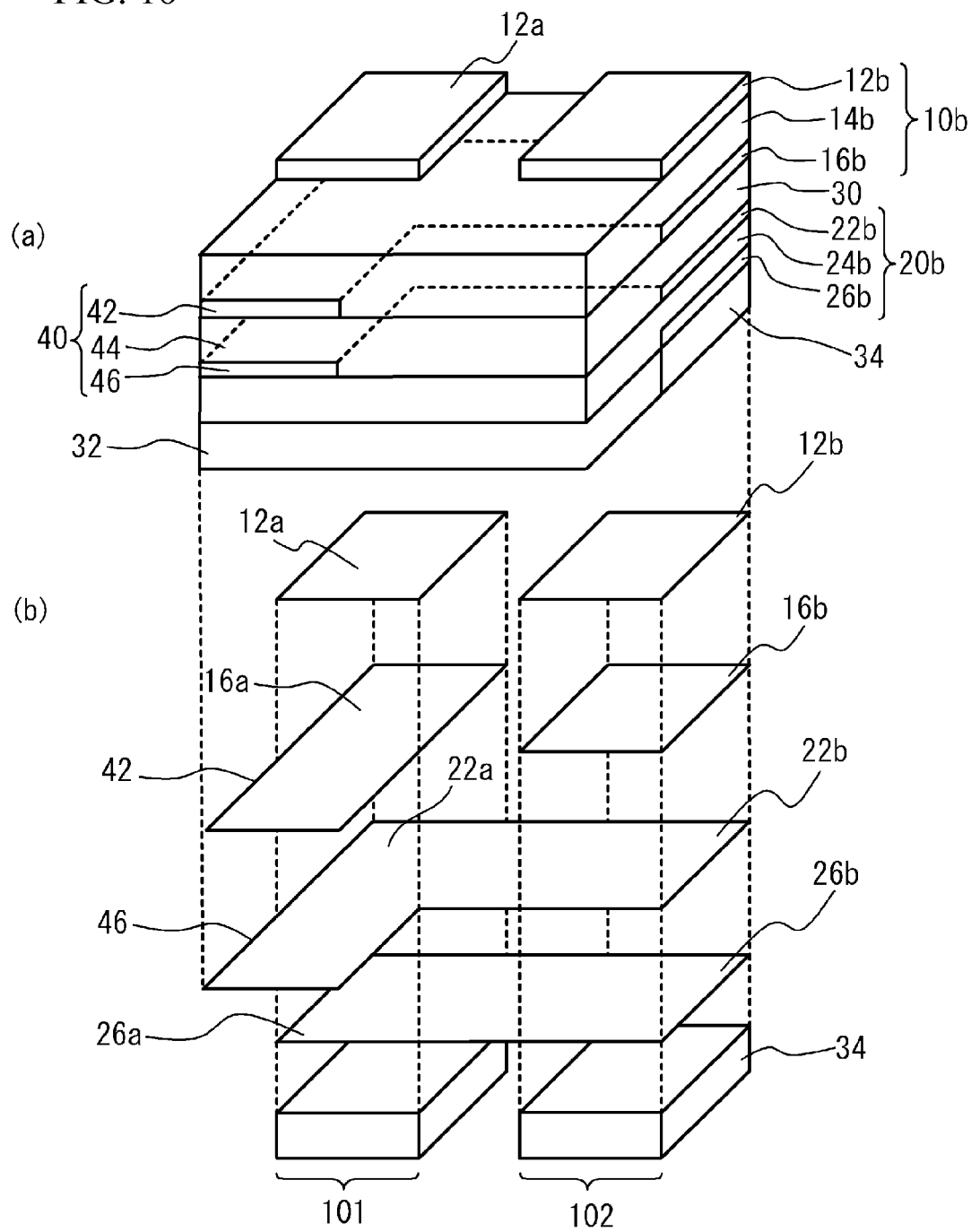
FIG. 16 includes a perspective view (a) of the embodiment 2 and an exploded perspective view (b) of electrodes and spaces.

A part (a) of FIG. 16(*a*) is a perspective view of the embodiment 2, and a part (b) of FIG. 15 an exploded perspective view in which electrodes and spaces are exploded for facilitating understanding. An upper electrode 42 of the capacitor 40 is made of a material identical to that of the electrode 16*a* and is continuously formed in one piece. A lower electrode 46 of the capacitor 40 is made of a material identical to that of the electrodes 22*a* and 22*b* and is continuously formed in one piece. The insulation film 30 is used for a dielectric 44 of the capacitor 40. The capacitor 40 is formed outside of the resonance regions of the SCFs 101 and 102.

In the embodiment 1, as long as the resonators 10*a* and 20*a* (and 10*b* and 20*b*) are mechanically coupled with each other, the insulation film 30 may not be provided. However, as in the case of the embodiment 2, the two piezoelectric thin-film resonators 10*a* and 20*a* (and 10*b* and 20*b*) are stacked so that the insulation film 30 is interposed therebetween. The capacitor 40 is formed so that the insulation film 30 is used as the dielectric 44 and is vertically interposed between a pair of electrodes 42 and 46 (second electrodes). It is thus possible to unify the step of growing the dielectric 44 of the capacitor 40 and the step of forming the insulation film 30 and to simplify the fabrication process.

According to the embodiment 2, the electrode 16*a* (first electrode) connected to the input terminal of the SCF 101 of the preceding stage is continuously formed with the electrode 42 (one of the paired second electrodes) on a surface of the insulation film 30. The electrode 22*b* (first electrode) connected to the input terminal of the SCF 102 of the following stage is continuously formed with the electrode 46 (the other one of the paired electrodes) on a surface of the insulation film 30 opposite to the former surface. Thus, it is possible to unify the step of growing the films of the electrodes 42 and 46 of the capacitor 40 and the step of forming the electrodes of the SCFs 101 and 102 and to simplify the fabrication process.

Further, in the embodiment 2, the capacitor 40 is formed outside of the resonance regions of the piezoelectric thin-film resonators of the SCFs 101 and 102. It is thus possible to restrict disturbing the vibrations of the resonators by the capacitor 40.

Figure 17:
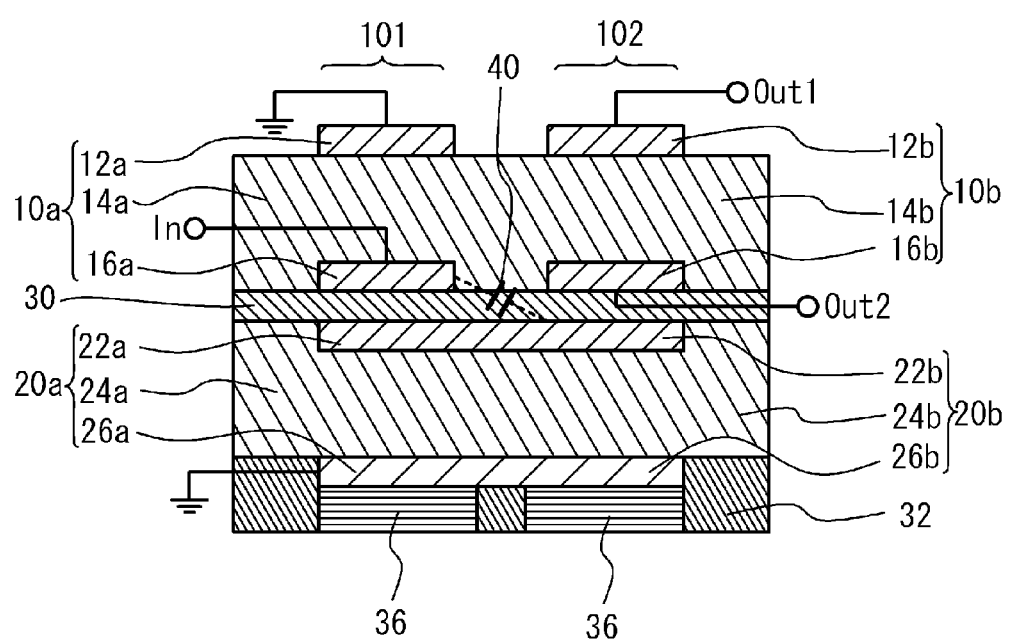
FIG. 17 is a schematic perspective view of another example of the embodiment 2.

FIG. 17 is a schematic cross-sectional view of another example of the embodiment 2. As illustrated in FIG. 17, the cavities 34 formed in the substrate 32 may be replaced with acoustic multilayer films 36. The other structures are the same as those in FIG. 15, and a description thereof is omitted.

Embodiment 3

An embodiment 3 is an exemplary filter in which SCFs are connected in cascade over eight stages. FIG. 18(*a*) is a schematic cross-sectional view of a comparative example 3, and FIG. 18(*b*) is a schematic cross-sectional view of the embodiment 3. As illustrated in FIG. 18(*a*), in the comparative example 3, SCFs 101~108 are connected in cascade. As illustrated in FIG. 18(*b*), in the embodiment 3, a capacitor 40*a* is connected between the input terminal of the SCF 101 and the input terminal of the SCF 102. Similarly, a capacitor 40*b* is connected between the SCFs 103 and 104, a capacitor 40*c* between the SCFs 105 and 106, and a capacitor 40*d* between the SCFs 103 and 104. The comparative example 3 and the embodiment 3 are configured to have identical film thicknesses and areas of the SCFs 101~108. The capacitances of the capacitors 40*a*~40*d* of the second embodiment are 0.14 pF, 67 fF, 61 fF and 59 fF, respectively.

Figure 19:
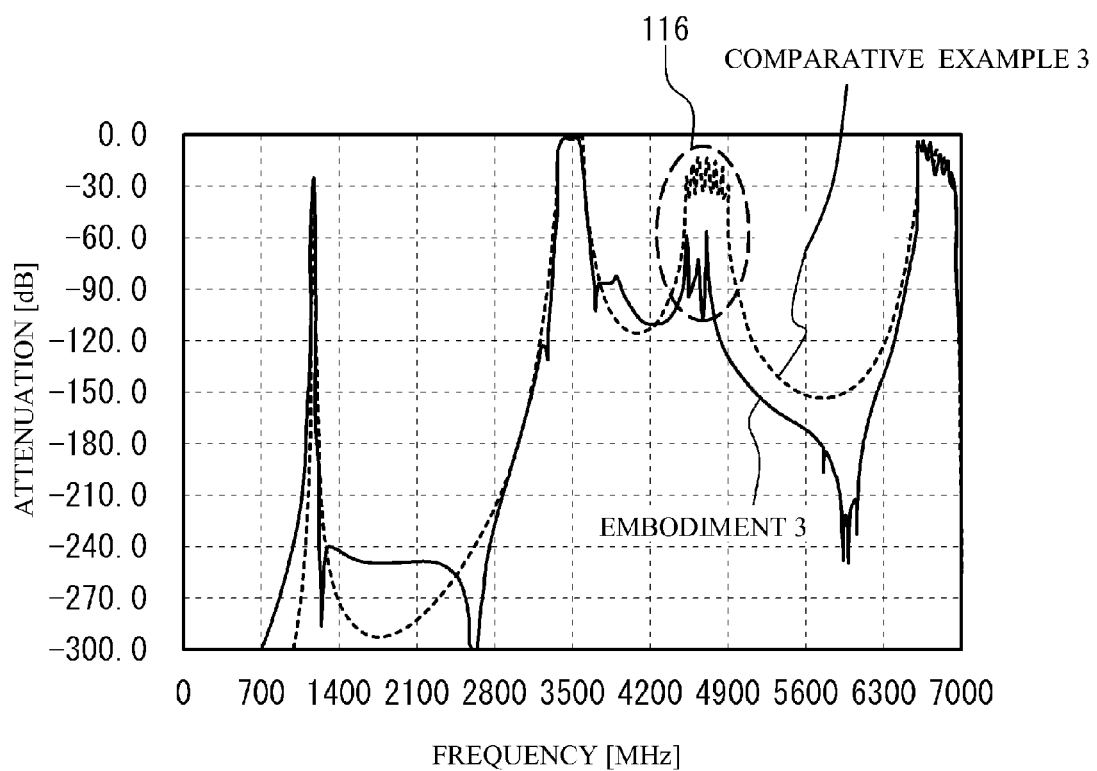
FIG. 19 illustrates bandpass characteristics of the comparative example 3 and the embodiment 3.

FIG. 19 illustrates results of simulating the bandpass characteristics of the embodiment 3 and the comparative example 3. As illustrated in FIG. 19, the unwanted response 116 of the embodiment 3 is reduced, as compared with the comparative example 3. In a filter element composed of not less than two SCFs connected in cascade, multiple capacitors are provided and the capacitances thereof are selected so as to differ from each other. That is, all the capacitors are arranged to have mutually different capacitances. It is thus possible to suppress the unwanted response 116.

All the capacitors have may not have mutually different capacitances. For example, in the filter element composed of not less than two SCFs connected in cascade, multiple capacitors are provided, and the capacitance of at least one of the multiple capacitors is selected so as to greatly differ from the capacitances of the other capacitors. It is thus possible to suppress the unwanted response 116.

Figure 20:
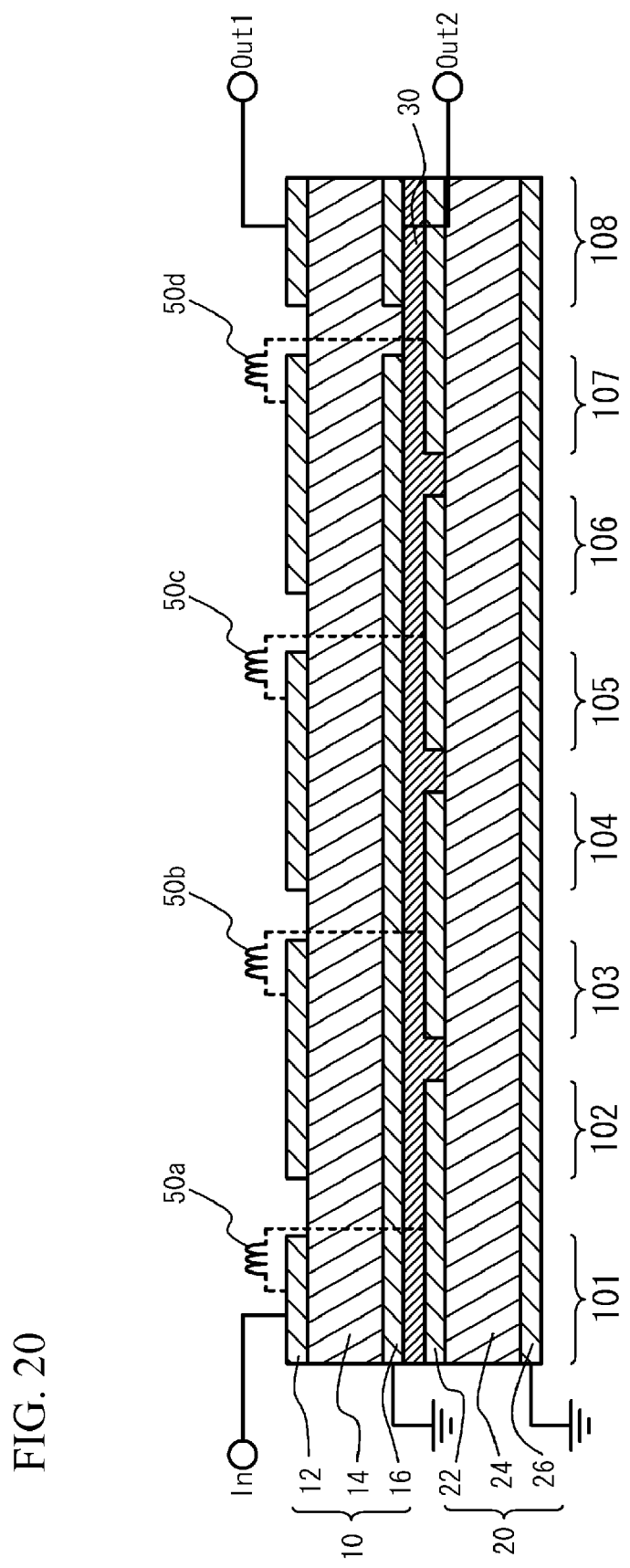
FIG. 20 is a schematic cross-sectional view of another example of the embodiment 3.

FIG. 20 illustrates another example of the embodiment 3. As illustrated in FIG. 20, in this example of the embodiment 3, an inductor 50*a* is connected between the input terminal of the SCF 101 and the input terminal of the SCF 102. Similarly, an inductor 50*b* is connected between the SCFs 103 and 104, an inductor 50*c* between the SCFs 105 and 106, and an inductor 50*d* between the SCFs 107 and 108. As in the case of the embodiment 3, in a filter element composed of three or more SCFs connected in cascade, multiple inductors are provided and are arranged so as to have mutually different inductances. It is thus possible to suppress the unwanted response 116.

All the inductors may not have mutually different inductances. For example, in the filter element composed of three or more SCFs connected in cascade, multiple inductors are provided, and the inductance of at least one of the multiple inductors is selected so as to greatly differ from the inductances of the other inductors. It is thus possible to suppress the unwanted response 116.

The examples of the filter elements of the embodiments 1~3 described above are the exemplary unbalanced input-balanced output filters, but may be unbalanced input-unbalanced output filters or balanced input-unbalanced output filters.

The embodiments 1~3 described above are the examples in which Ru is used for the electrodes 12, 16, 22 and 26. However, another metal may be used. The embodiments 1~3 described above are the examples in which aluminum nitride (AlN) is used for the piezoelectric films 14 and 24. However, the piezoelectric films 14 and 24 may be zinc oxide or the like having the main axis in the (002) direction, for example. Although the use of silicon oxide (SiO) for the insulation film 30 is exemplarily described, it is required that the piezoelectric thin-film resonators 10 and 20 are mechanically connected together.

Embodiment 4

Figure 21:
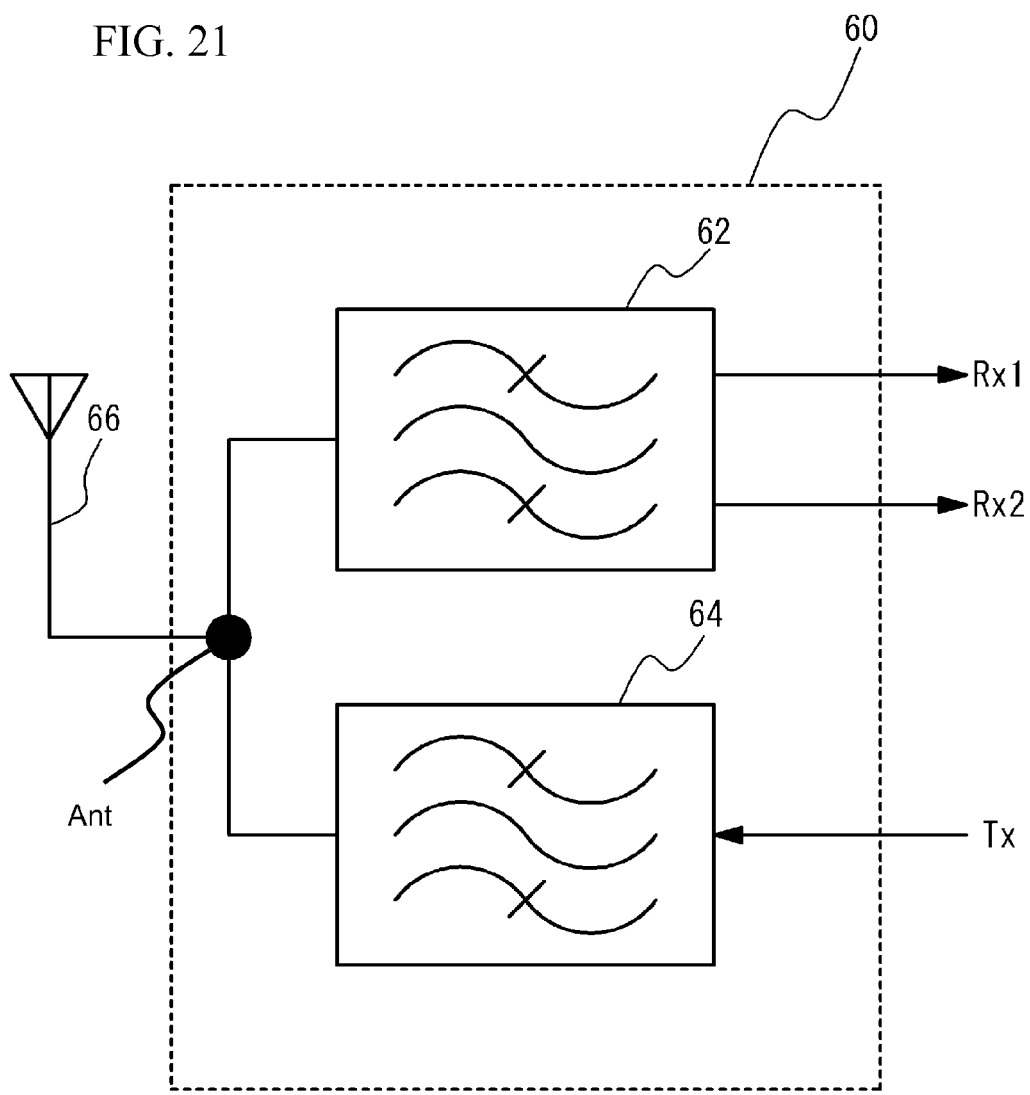
FIG. 21 is a block diagram of an embodiment 4.

An embodiment 4 is an exemplary duplexer. FIG. 21 is a block diagram of a duplexer in accordance with the embodiment 4. A duplexer 60 includes a reception filter 62 and a transmission filter 64. Reception terminals Rx1 and Rx2 are balanced outputs, and a reconnected to a reception circuit. A transmission terminal Tx is an unbalanced terminal, and is connected to a transmission circuit. The common terminal is connected to an antenna 66. The reception filter 62 is connected between the reception terminals Rx1 and Rx2 and the common terminal Ant. The transmission filter 64 is connected between the transmission terminal Tx and the common terminal Ant.

The transmission filter 64 passes signals in the transmission band, and suppresses signals in the reception band. The reception filter 62 passes signals in the reception band, and suppresses signals in the transmission band. Thus, the transmission signal that is input to the transmission terminal Tx passes through the transmission filter 64, and is output via the common antenna terminal Ant. However, the transmission signal is not output via the reception terminals Rx1 and Rx2. The reception signal that is input via the common terminal Ant passes through the reception filter 62 and is output via the reception terminals Rx1 and Rx2. However, the reception signal is not output via the transmission terminal Tx.

At least one of the transmission filter 64 and the reception filter 62 of the duplexer of the embodiment 4 may be the filter element of any of the embodiments 1~3. Since SCF easily realizes balanced inputs and outputs, it is preferable that the filter element of any of the embodiments 1~3 is used for the reception filter 62 that is required to have balanced outputs for taking measures against noise.

Embodiment 5

Figure 22:
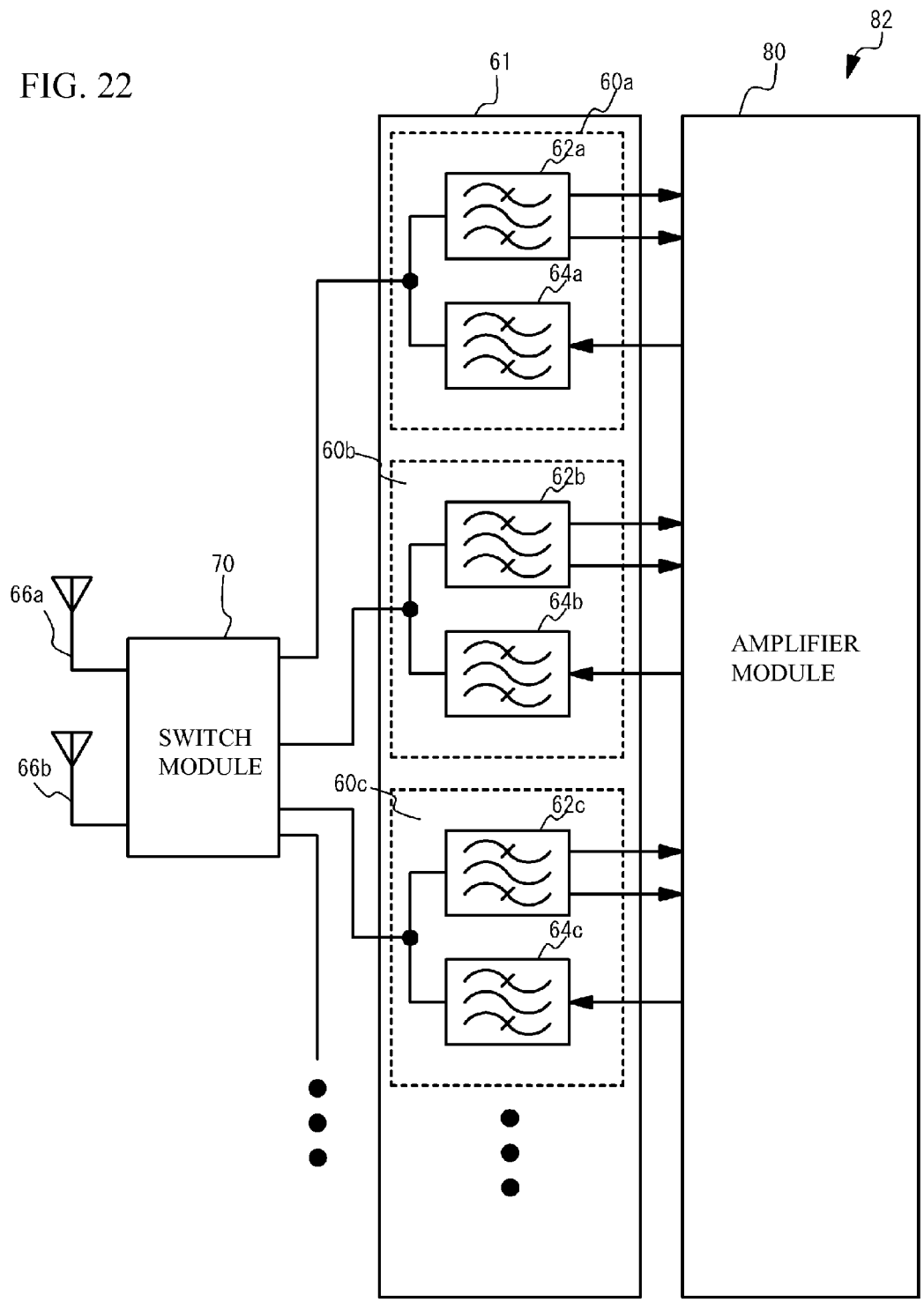
FIG. 22 is a block diagram of an embodiment 5.

An embodiment 5 is a cellular phone that is an exemplary electronic device. FIG. 22 is a block diagram of an RF (Radio Frequency) part 82 of a cellular phone. The RF part 82 is capable of switching multiple communication systems. The RF part 82 includes antennas 66a and 66b, a switch module 70, a duplexer bank module 61, an amplifier module 80. The switch module 70 connects duplexers 60a~60c and antennas 66a and 66b in accordance with the communication systems. The duplexer bank module 61 has multiple duplexers 60a~60c. The duplexers 60a~60c respectively include transmission filters 64a~64c and reception filters 62a~62c. The structures of the duplexers 60a~60c are the same as the structure of the embodiment 4, and a description thereof is omitted. The amplifier module 80 includes power amplifiers that amplify the transmission signals and output the amplified transmission signals to the transmission terminals, and low noise amplifiers that amplify reception signals output from the reception terminals of the duplexers.

At least one of the duplexers 60a~60c may be the duplexer 60 of the embodiment 4. Although the cellular phone is described as an exemplary electronic device in the embodiment 5, the filter elements of the embodiments 1~3 may be applied to another electronic device.

The embodiments of the invention have been described in detail. However, the present invention is not limited to the specifically described embodiments but may have various variations and changes within the scope of the claimed invention.

What is claimed is:

1. A filter element comprising:
   a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
   an inductor connected between an input terminal of one of the plurality of multilayer filters of a preceding stage and an input terminal of another one of the plurality of multilayer filters of a following stage,
   exciting directions of the piezoelectric thin-film resonators to which the input terminals of the multilayer filters of the preceding and following stages are connected being identical to each other.

2. The filter element according to claim 1, wherein the plurality of multilayer filters are three or more multilayer filters connected in cascade, and multiple inductors each corresponding to said inductor are provided, at least one of the multiple inductors having an inductance different from inductances of a remaining one of the multiple inductors.

3. The filter element according to claim 1, wherein the plurality of multilayer filters are three or more multilayer filters connected in cascade, and the multiple inductors each corresponding to said inductor are provided, and the multiple inductors having mutually different inductors.

4. A filter element comprising:
   a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
   a capacitor connected between an input terminal of one of the plurality of multilayer filters of a preceding stage and an input terminal of another one of the plurality of multilayer filters of a following stage,
   exciting directions of the piezoelectric thin-film resonators to which the input terminals of the multilayer filters of the preceding and following stages are connected being opposite to each other,
   wherein the plurality of multilayer filters are three or more multilayer filters connected in cascade, and multiple capacitors each corresponding to said capacitor are provided, at least one of the multiple capacitors having a capacitance different from capacitances of a remaining one of the multiple capacitors.

5. The filter element according to claim 4, wherein the plurality of multilayer filters are three or more multilayer filters connected in cascade, and the multiple capacitors each corresponding to said capacitor are provided, and the multiple capacitors having mutually different capacitances.

6. The filter element according to claim 4, wherein:
   two of the plurality of piezoelectric thin-film resonators are stacked so that an insulation film is interposed therebetween; and the capacitor includes a pair of second electrodes between which the insulation film is vertically interposed.

7. The filter element according to claim 6, wherein:
the first electrode connected to the input terminal of the multilayer filter of the preceding stage is formed continuously with one of the pair of second electrodes on a surface of the insulation film; and
the first electrode connected to the input terminal of the multilayer filter of the following stage is formed continuously with the other one of the pair of second electrodes on another surface of the insulation film opposite to said surface thereof.

8. The filter element according to claim 7, wherein the capacitor is formed outside of resonance regions of the two of the plurality of piezoelectric thin-film resonators.

9. A duplexer comprising:
a transmission filter; and
a reception filter,
at least one of the transmission filter and the reception filter includes:
a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
a capacitor connected between an input terminal of one of the plurality of multilayer filters of a preceding stage and an input terminal of another one of the plurality of multilayer filters of a following stage,
exciting directions of the piezoelectric thin-film resonators to which the input terminals of the multilayer filters of the preceding and following stages are connected being opposite to each other,
wherein the plurality of multilayer filters are three or more multilayer filters connected in cascade, and multiple capacitors each corresponding to said capacitor are provided, at least one of the multiple capacitors having a capacitance different from capacitances of a remaining one of the multiple capacitors.

10. A duplexer comprising:
a transmission filter; and
a reception filter,
at least one of the transmission filter and the reception filter includes:
a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
an inductor connected between an input terminal of one of the plurality of multilayer filters of a preceding stage and an input terminal of another one of the plurality of multilayer filters of a following stage,
exciting directions of the piezoelectric thin-film resonators to which the input terminals of the multilayer filters of the preceding and following stages are connected being identical to each other.

11. An electronic device comprising:
a duplexer module having a transmission filter and a reception filter; and
an amplifier module connected to the duplexer module,
at least one of the transmission filter and the reception filter includes:
a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
a capacitor connected between an input terminal of one of the plurality of multilayer filters of a preceding stage and an input terminal of another one of the plurality of multilayer filters of a following stage,
exciting directions of the piezoelectric thin-film resonators to which the input terminals of the multilayer filters of the preceding and following stages are connected being opposite to each other,
wherein the plurality of multilayer filters are three or more multilayer filters connected in cascade, and multiple capacitors each corresponding to said capacitor are provided, at least one of the multiple capacitors having a capacitance different from capacitances of a remaining one of the multiple capacitors.

12. An electronic device comprising:
a duplexer module having a transmission filter and a reception filter; and
an amplifier module connected to the duplexer module,
at least one of the transmission filter and the reception filter includes:
a plurality of multilayer filters that are connected in cascade, each of the plurality of multilayer filters including a plurality of piezoelectric thin-film resonators stacked vertically, each of the piezoelectric thin-film resonators including a piezoelectric film and a pair of first electrodes between which the piezoelectric film is interposed; and
an inductor connected between an input terminal of one of the plurality of multilayer filters of a preceding stage and an input terminal of another one of the plurality of multilayer filters of a following stage,
exciting directions of the piezoelectric thin-film resonators to which the input terminals of the multilayer filters of the preceding and following stages are connected being identical to each other.

* * * * *